United States Patent
Agrawal et al.

(10) Patent No.: US 10,096,377 B1
(45) Date of Patent: *Oct. 9, 2018

(54) SIMULTANEOUS SCAN CHAIN INITIALIZATION WITH DISPARATE LATCHES

(71) Applicant: International Business Machines Corporation, Armonk, NY (US)

(72) Inventors: Mitesh Agrawal, Bangalore (IN); Benedikt Geukes, Stuttgart (DE); Krishnendu Mondal, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,243

(22) Filed: Dec. 27, 2017

Related U.S. Application Data

(63) Continuation of application No. 15/482,952, filed on Apr. 10, 2017.

(51) Int. Cl.
*G11C 7/00* (2006.01)
*G11C 29/02* (2006.01)
(Continued)

(52) U.S. Cl.
CPC .......... *G11C 29/023* (2013.01); *G11C 7/1012* (2013.01); *G11C 7/20* (2013.01); *G11C 7/22* (2013.01)

(58) Field of Classification Search
CPC ....... G11C 29/023; G11C 7/1012; G11C 7/20; G11C 7/22
USPC ... 365/189.02, 51, 63, 129, 189.011, 189.14, 365/189.17, 189.05, 189.08, 189.12, 191, 365/193, 201, 230.01, 230.02, 233.1, 239, 365/240
See application file for complete search history.

(56) References Cited

U.S. PATENT DOCUMENTS 8,000,950 B2    8/2011    Hira et al.
8,719,651 B1    5/2014    Dev et al.
(Continued)

FOREIGN PATENT DOCUMENTS

DE      10214123 B4    10/2015
EP      2747289 B1    7/2015
JP      2009080634 A    4/2009

OTHER PUBLICATIONS

Liang et al., "Multi-function Controller for Low-Power Multiple Scan Test of Transition Delay Faults," May 7-10, 2014, 3 pgs, http://ieeexplore.ieee.org/stamp/stamp.jsp?arnumber=6839366, © 2014 IEEE.

(Continued)

*Primary Examiner* — Fernando Hidalgo
(74) *Attorney, Agent, or Firm* — Christopher M. Coy

(57) ABSTRACT

Provided is an integrated circuit that includes a reset electrically connected to a select line of a multiplexer and an OR gate. The multiplexer receives data from a power source. The multiplexer and the OR gate comprise a circuit. A clock is electrically connected to the OR gate. The OR gate is electrically connected to a clock input of a latch. The latch includes the clock input, a scan enable input, a data input, and a data output. A regular logic data path is electrically connected to the multiplexer, and the multiplexer is further electrically connected to the data port of the latch.

1 Claim, 6 Drawing Sheets

(51) Int. Cl.
*G11C 7/20* (2006.01)
*G11C 7/10* (2006.01)
*G11C 7/22* (2006.01)

(56) References Cited

U.S. PATENT DOCUMENTS

| | | |
|---|---|---|
| 9,411,912 B1 | 8/2016 | Sood et al. |
| 9,576,625 B1 | 2/2017 | Chromczak |
| 2010/0293424 A1 | 11/2010 | Katagi et al. |
| 2013/0272072 A1* | 10/2013 | Cummings ...... G11C 29/56004 365/189.02 |
| 2014/0289578 A1 | 9/2014 | Sugiyama |
| 2015/0295560 A1 | 10/2015 | Pal et al. |
| 2017/0146600 A1 | 5/2017 | Vaidyanathan et al. |

OTHER PUBLICATIONS

Agrawal et al., "Simultaneous Scan Chain Initialization With Disparate Latches," U.S. Appl. No. 15/482,952, filed Apr. 10, 2017.
List of IBM Patents or Patent Applications Treated as Related, Dec. 27, 2017, 2 pgs.

* cited by examiner

US 10,096,377 B1

SIMULTANEOUS SCAN CHAIN INITIALIZATION WITH DISPARATE LATCHES

BACKGROUND

The present invention relates in general to the field of integrated circuits, and in particular to a method for scan chain initialization in integrated circuits.

As Moore's Law predicts, integrated computer chips are becoming more crowed due to complex circuitry. Scan chain is an efficient method for testing every flip-flop in an integrated computer chip prior to distribution, and helps to reduce the complexity of testing an integrated circuit with a considerably large portion of logic. A scan chain-enable pin may be integrated into an integrated circuit design. Testing is accomplished in a linear fashion according to latch type of each flip-flop, and a different clock domain may be designed to trigger each different latch type. Scan chain methods may include a partial scan that scans a portion of the total number of flip-flops, and a multiple scan chain that reduces test time by designing multiple scan chains in parallel.

SUMMARY

Embodiments of the present disclosure include an integrated circuit that includes a reset electrically connected to a select line of a multiplexer and an OR gate. The multiplexer receives data from a power source. The multiplexer and the OR gate comprise a circuit. A clock is electrically connected to the OR gate. The OR gate is electrically connected to a clock input of a latch. The latch includes the clock input, a scan enable input, a data input, and a data output. A regular logic data path is electrically connected to the multiplexer, and the multiplexer is further electrically connected to the data port of the latch.

Embodiments of the present disclosure include an integrated circuit that includes a reset that is electrically connected to a reset input of a first latch, a select line of a multiplexer, and an OR gate. The multiplexer receives data from a power source. The multiplexer and the OR gate comprise a circuit. The first latch includes the reset input, a data port, a scan enable input, a clock input, and a data output. A first regular logic data path is electrically connected to the first latch data port. The first latch data output is electrically connected to a second regular logic data path. The second regular logic data path is electrically connected to the multiplexer. A first clock is electrically connected to the first latch clock input. A second clock is electrically connected to the OR gate. The OR gate is electrically connected to a clock input of a second latch. The second latch includes the clock input, a scan enable input, a data input, and a data output. The multiplexer is electrically connected to the data port of the latch. The second latch data output is electrically connected to a third regular logic data path.

Embodiments of the present disclosure include a method. The method includes determining that an integrated circuit is in a test mode. The integrated circuit includes an initialization circuit and two or more disparate latches. The initialization circuit includes a multiplexor and an OR gate. A reset is electrically connected to a select line of the multiplexer and a first input of the OR gate. A clock is electrically connected to a second input of the OR gate. An output of the OR gate is electrically connected to a clock input of a first latch. A logic data path is electrically connected to a first input of the multiplexer. An output of the multiplexer is connected to a data input of the first latch. The method further includes enabling a data stream to be shifted from one latch of the two or more latches to another latch of the two or more latches in response to determining that the integrated circuit is in the test mode. The method further includes setting a reset pin. The method further includes initializing the two or more latches.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
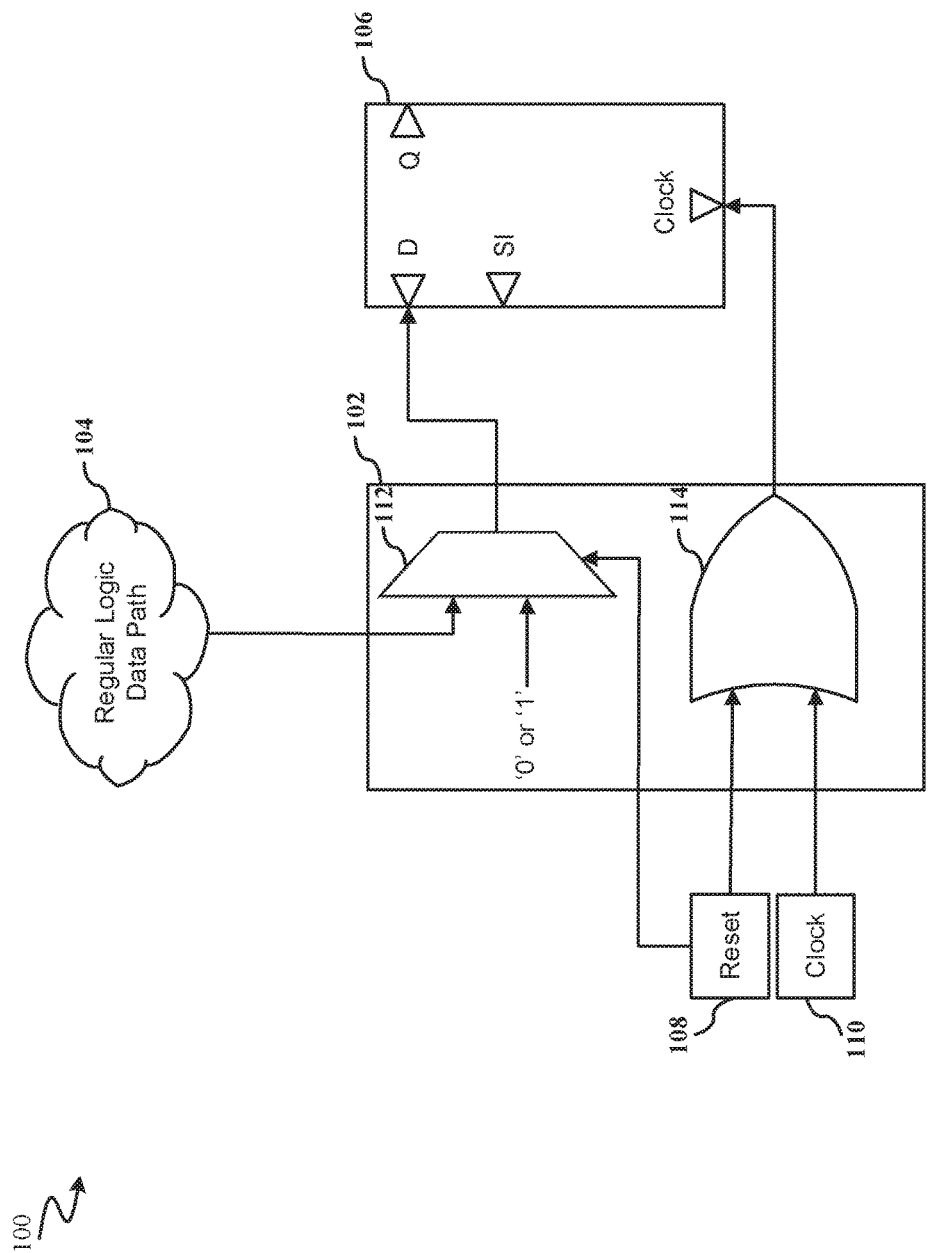
FIG. 1 illustrates a multiplexer and an OR gate integrated into a circuit design that is electrically connected to a latch according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is common for integrated circuit technology to use scan-based design methodologies and techniques to facilitate design, testing, and diagnostics. In scan designs, especially full scan designs, sequential circuits are converted into combinational circuits via scannable latches or flip-flops during testing or for configuration purposes. Using a scan-based design, structural testing may be more controllable and observable. Another aspect of using scan designs is that the test cost is less than functional testing, especially for submicron designs. Scan-based design can also be used to provide separate means to access logic in the functional data path of an integrated circuit.

Boundary scan is a method for testing interconnects (wire lines) on printed circuit boards or sub-blocks inside an integrated circuit. Boundary scan is also widely used as a debugging method to watch integrated circuit pin states, measure voltage, or analyze sub-blocks inside an integrated circuit. Boundary-scan cells in a device can capture data from pin or core logic signals, or force data onto pins. Captured data is serially shifted out and externally compared to the expected results. Forced test data is serially shifted into the boundary-scan cells. All of this is controlled from a serial data path called the scan path or scan chain. For normal operation, the added boundary-scan latch cells are set so that they have no effect on the circuit, and are therefore effectively invisible. However, when the circuit is set into a test mode, the latches enable a data stream to be shifted from one latch into the next. Once a complete data word has been shifted into the circuit under test, it can be latched into place so it drives external signals. Shifting the word also generally returns the input values from the signals configured as inputs.

In some complex design cases, there can be a combination of different types of latch circuits (e.g., high-performance, high-efficiency, set-reset, positive edge triggered, negative edge triggered) in a same clock frequency domain, which, in the current state of the art, cannot be simultaneously initialized in a single cycle during latch initialization. In the current state of the art, different types of latch circuits are run in sequence, and may be in different clock frequency domains. Latches of a same type are grouped together in a scan chain, and in an integrated circuit with different types of latches, there are multiple scan chain types. Additionally, if a scan chain has both a positive-edge triggered and a negative-edge triggered latch, the scan chain is required to have the negative-edge triggered latches grouped together first, followed by the positive-edge triggered latches grouped together to preserve the data integrity during scan operation. This requirement is only possible (if at all) with significant additional setup effort and potential delays for a scan-optimized design, i.e., a design that allows all latches of varying types to be tested simultaneously (i.e., at a same time). The latches of varying types must be grouped together according to latch type, and then scanned in a linear order during a scan initialization phase.

Typically, additional steps are required in between two different types of latch scan operations in order to configure different scan chains for the initialization. Therefore, typically the initialization process in current state of the art designs, which have multiple latch-types, is a time consuming process. Additionally, given that testing methods of an integrated circuit can cost roughly half as much as the integrated circuit, efficient methods to reduce the cost of testing, such as reducing the total test time and test power consumption, can substantially increase revenue. However, if a design has multiple latch types and there is a logic requirement that all the latches have to be initialized in a single cycle, then the existing structure and method of scan initializing one chain after another will not work.

Therefore, it may be advantageous to, among other things, provide a way to integrate additional circuitry into an integrated circuit such that all latch types can be initialized in a single cycle without the requirement of grouping different latches in separate scan chains, such as placing negative-edge triggered latches before the positive-edge triggered latches in a scan chain. As described herein, this may be accomplished by adding a multiplexer and an OR gate in between disparate types of latches.

State of the art solutions apply either functional reset to set/reset latches or dedicated scan operations for scan latch designs (e.g., an integrated circuit with S-R latch followed by a non-SR latch in a scan chain). The latches cannot be initialized in single cycle, such as a second latch that includes a set/reset latch in a series of latches that does not have set/reset capability and hence a dedicated scan operation. This may take multiple cycles to initialize the latches.

In some embodiments of the present disclosures, the data port of a latch is used to load the initial value in one single cycle (e.g., with a series of two latches, one set-reset (S-R) latch followed by a non-S-R latch). Both types of latches can be placed in the same scan chain. When the "Reset" signal goes high, the S-R latch gets loaded with '0'. The same "reset" signal is used to gate a clock feeding the non-S-R latch and goes to the select line of a multiplexer feeding the data input of the latch. For the non-S-R latch, when reset signal is high, the data-input is fed with the "initial" data, while the clock input of the latch is also high. Thus, both the S-R latch and the non-S-R latch may be loaded with the initial data in the same cycle when "reset" is high.

The following described exemplary embodiments provide a structure and method in which a design having multiple latch circuit types can be initialized in one cycle without any grouping requirement of different types of latches. In the proposed structure, all latch types can be placed in a single chain with no constraint of grouping same types of latches together. Initialization data is loaded in the latch through the data-port instead of the scan-in port. Thus, there is no requirement of scan initialization, and since there is no constraint on grouping the same type of latches, scan chain initialization can be much more efficient than previous techniques. It is to be understood that the aforementioned advantages are example advantages and should not be construed as limiting. Embodiments of the present disclosure can contain all, some, or none of the aforementioned advantages while remaining within the spirit and scope of the present disclosure.

Different types of latches require dedicated scan chains or specific requirements of latch grouping in order to initialize the scan design. All latches of the same scan type on dedicated scan chains and multiple scan chains need to be shifted, and positive edge triggered latches and negative edge triggered latches need to be initialized in specific order to avoid race conditions. Additionally, specific logic requirements exist to have all latches, no matter which type, to be initialized within the same cycle with the same method.

An integrated circuit introduced with this disclosure is placed in front of the latches so that a transition of disparate latch types may be tested in a same scan chain. The integrated circuit may be made up of a multiplexer and an OR gate. A structure of multiple latches of different latch types, which are equipped with the integrated circuit such that all serial attached latches can be reset/set within the same cycle, may be initialized simultaneously in the same scan chain. A structure that includes multiple latches of different latch types that can be attached to a series of latches without acknowledging the ordering to reset/set them in the same cycle is introduced herein. The disclosed integrated circuit that includes a multiplexer and OR gate may allow a clock independent reset/set of a structure of mixed type latches/clocked storage elements to be initialized simultaneously.

Referring to FIG. 1, depicted is a multiplexer 112 and an OR gate 114 integrated into a circuit 102, in accordance with at least one embodiment. For simplicity, FIG. 1 depicts only a single circuit 102, regular logic data path 104, and latch 106. In this case, the latch 106 may be depicting a non-set-reset latch following a set-reset latch (not shown), but the set-reset latch has been left out of FIG. 1 in order to depict the circuit 102 more clearly. There may be as many circuits 102 as is needed to initialize latches 106 of various types in an integrated circuit in a single clock frequency cycle.

The circuit 102 may include a multiplexer 112 and an OR gate 114, and may be electrically connected to a regular logic data path 104 and a latch 106. The regular logic data path 104 may be a collection of functional units, such as arithmetic logic units or multipliers that perform data processing operations, registers, and buses. The regular logic data path 104 may be a processing unit, and one or more regular logic data paths 104 may be included in an integrated circuit, each with a different processing operation. In some embodiments, the latch 106 may be any type of latch (e.g., a high-performance, high-efficiency, positive edge triggered, negative edge triggered). The latch 106 may include a data port (D), a scan enable port (SI), a clock input (clock), and an output (Q). The circuit 102 and the latch 106 may be included within the regular logic data path 104, but for clarity, have been shown separately. By connecting the clock input of a second latch (not shown) to the reset 108 signal with the OR gate 114 may ensure that whenever the reset 108 signal is run "high" to initialize the set-reset latch, and it will also create a "high" signal at the second latch (not shown). If the second latch is a rising edge-triggered latch, this will cause the second latch (not shown) to grab the value on the data pin, thereby initializing the second latch at the same time. This is different from the current state of the art in that it is initializing using the data on the data pin, as opposed to the scan in pin.

Starting with electrical signal generation throughout FIG. 1, a reset 108 may output an electrical signal to a select line of the multiplexer 112 and to an input of the OR gate 114 of the circuit 102. The reset 108 may also be connected to a plethora of different circuits 102, regular logic data paths 104, and/or latches 106. In some cases, a set latch may take the place of the reset 108. A clock 110 may also output an electrical signal to a second input of the OR gate 114 of the circuit 102. The regular logic data path 104 may also output an electrical signal, either a '0' or a '1,' to the multiplexer 112. A '0' or a '1' may be inputted to the multiplexer 112 from a power source. In some cases, the power source may have an electrical connection between power voltage levels and a multiplexer 112 input, or a "buffer" between ground level to the multiplexer 112 input. In some cases, the power voltage may output a 1 (e.g. high level) in conjunction with an inverter circuit for '0' level input to the multiplexer 112, or two inverters in series may flip the '0' to a '1' to the multiplexer 112 input. The multiplexer 112 may receive a '1' (e.g., if a reset value of '1' is required) or a '0' (e.g., if a reset value of '0' is required). The multiplexer 112 may then output an electrical signal that is an initial value to a data port of the latch 106. The OR gate 114 may output an electrical signal to the clock input of latch 106. The latch 106 may output an electrical signal to either the regular logic data path 104, a similarly typed latch, and/or a circuit 102, none of which is shown.

Figure 2:
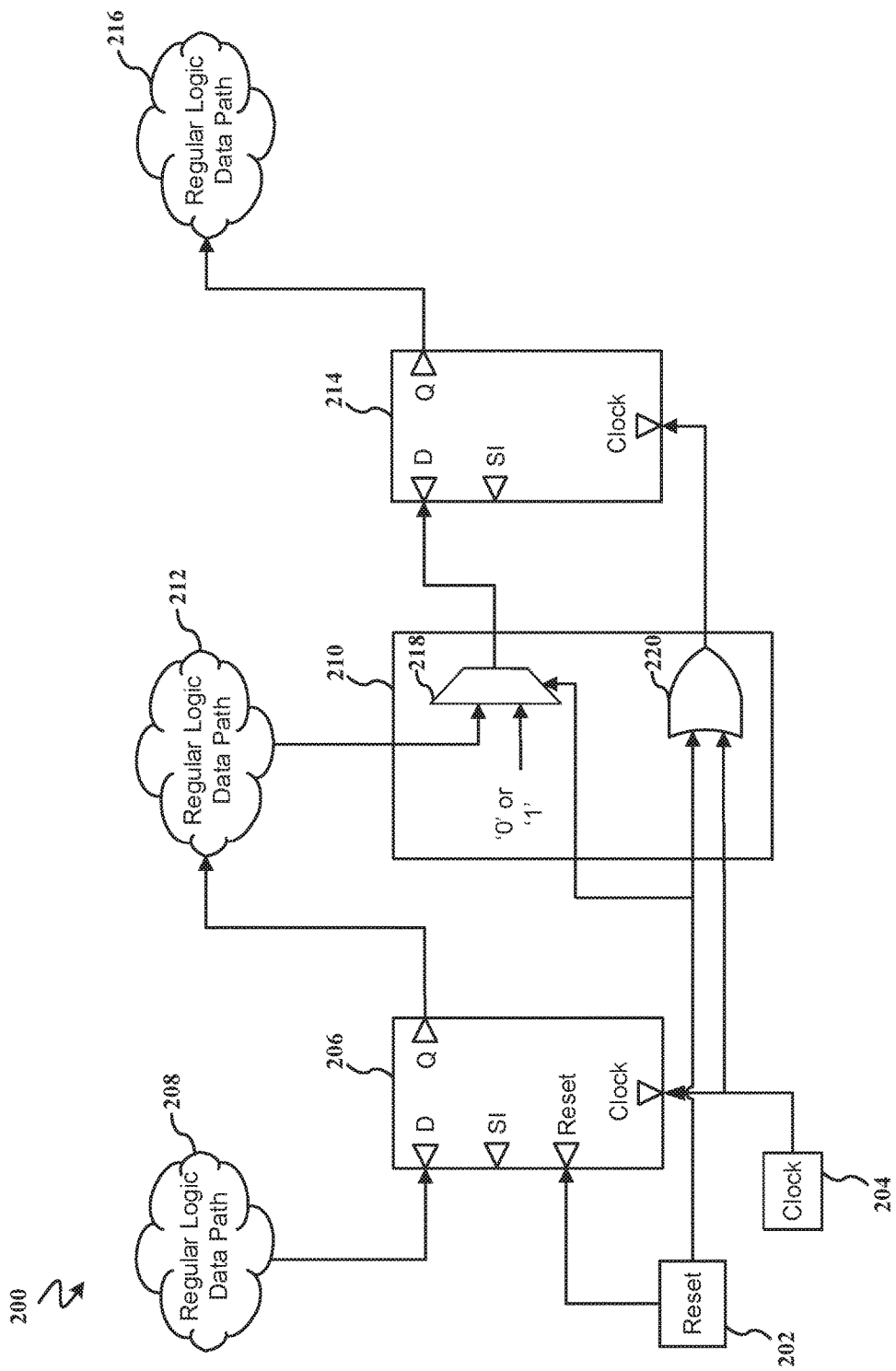
FIG. 2 illustrates a multiplexer and an OR gate integrated in between flip-flops with different latch types within a clock domain according to at least one embodiment.

Referring now to FIG. 2, a multiplexer 218 and an OR gate 220 integrated in between flip-flops with different latch types within a same clock frequency domain, according to at least one embodiment, is depicted. FIG. 2 includes a reset 202, a clock 204, a latch 206, a regular logic data path 208, a regular logic data path 212, a regular logic data path 216, a circuit 210, and a latch 214, all of which are included in a same clock frequency domain. Latch 206 is a set-reset latch and latch 214 is a non-set-reset latch. In some embodiments, the latch 206 and/or latch 214 may be any type of latch (e.g., a high-performance, high-efficiency, positive edge triggered, negative edge triggered). Regular logic data path 208, regular logic data path 212, and regular logic data path 216 may be the same regular logic data path or different regular logic data paths. The latch 206 may include a data port (D), a reset port (reset), a scan-enable port (SI), clock input (clock), and a data output (Q). The circuit 210 may include a multiplexer 218 and an OR gate 220. The latch 214 may include a data port (D), a scan enable port (SI), a clock input (clock), and an output (Q).

Starting with electrical signal generation throughout FIG. 2, a reset 202 may output an electrical signal to the reset port (reset) of the latch 206. When a reset 202 outputs a "high" signal, the latch 206 gets loaded with '0'. In some embodiments, the reset 202 may output a "low" signal. The same outputted high signal may be used to gate the clock 204 feeding the latch 214, and also goes to a select line of the multiplexer 218 feeding the data port of the latch 214. For latch 214, when reset signal is "high," the latch 214 data port is fed with the "initial" data, and the clock input of latch 214 is "high." Thus, both the set-reset latch 206 and the non-set-reset latch 214 can be loaded with the initial data in a same clock frequency cycle when reset 202 outputs a "high" signal.

In some cases, a set-latch may replace the reset 202. The reset may also be connected to a plethora of different circuits 210, regular logic data paths 210, and latches 214. The reset 202 may output an electrical signal to a select line of the multiplexer 218 and the OR gate 220. A '0' or a '1' may be inputted to the multiplexer 218 from a power source. In some cases, the power source may have an electrical connection between power voltage levels and a multiplexer 218 input, or a "buffer" between ground level to the multiplexer 218 input. In some cases, the power voltage may output a (e.g. high level) in conjunction with an inverter circuit for '0' level input to the multiplexer 218, or two inverters in series may flip the '0' to a '1' to the multiplexer 218 input. The multiplexer 218 may receive a '1' (i.e., if a reset value of '1' is required) or a '0' (i.e., if a reset value of '0' is required). A clock 204 may also output an electrical signal to the OR gate 220 and the clock input of latch 206. The regular logic data path 208 may also output an electrical signal, either a "0" or a "1," to data port of latch 206.

Latch 206 may then out put an electrical signal from the data output to the regular logic data path 212. The regular logic data path 212 may then perform an operation on the received electrical signal from latch 206, and then output the electrical signal to the multiplexer 218 of circuit 210, where an electrical signal is waiting from the reset 202. The multiplexer 218 may then output an electrical signal that is an initial value to a data port of the latch 214. The OR gate 220, where an electrical signal from reset 202 and an electrical signal from clock 204 have been sent, may output an electrical signal to the clock input of latch 214. Latch 214 may then output an electrical signal to either the regular logic data path 216, a similarly typed latch, or another circuit 210, none of which is shown.

Figure 3:
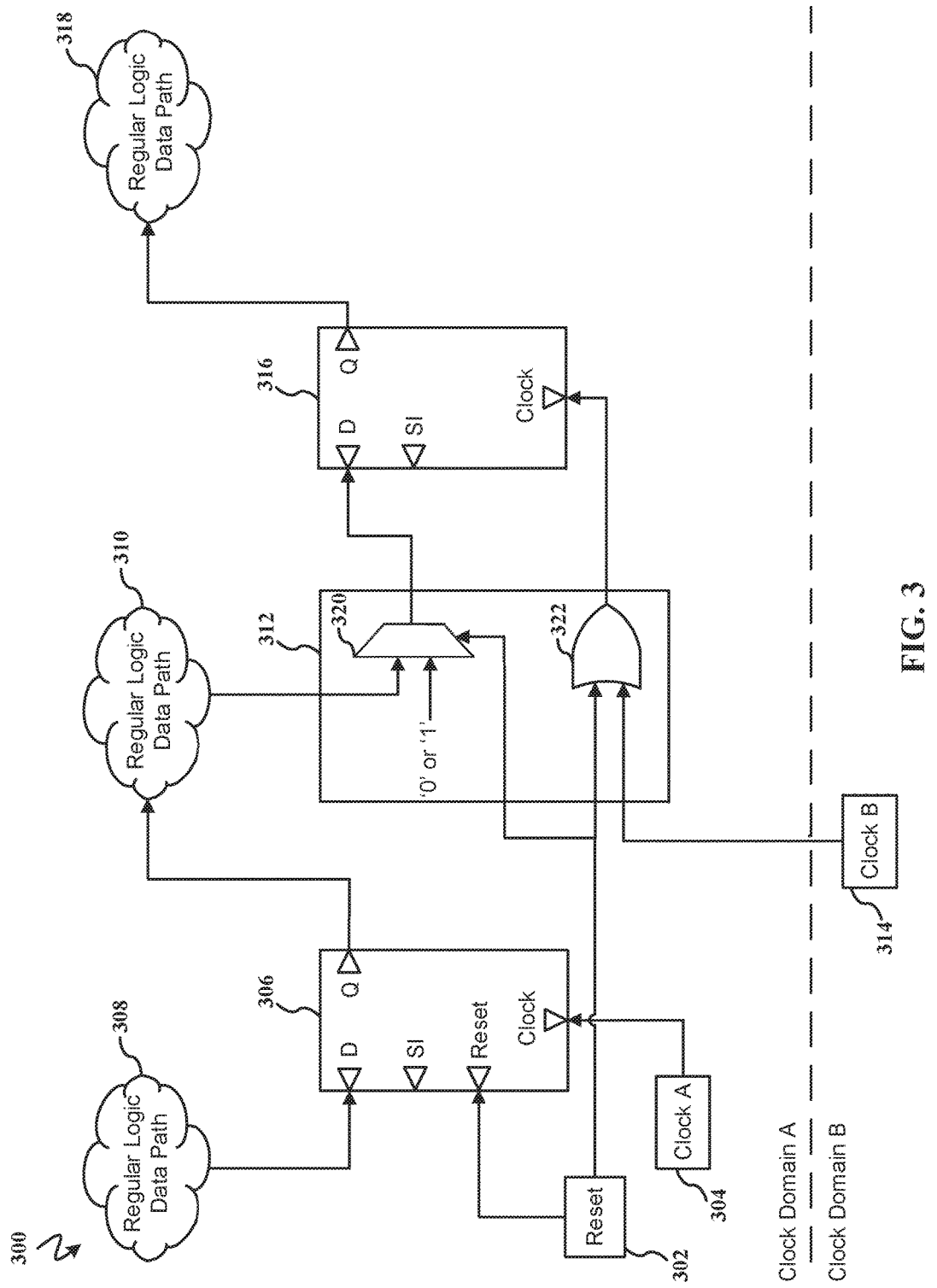
FIG. 3 illustrates a multiplexer and an OR gate integrated into in between flip-flops with different latch types in different clock domains according to at least one embodiment.

FIG. 3 illustrates a multiplexer 320 and an OR gate 322 integrated in between flip-flops with different latch types in different clock domains, in accordance with embodiments of the present disclosure. FIG. 3 includes a reset 302, a clock A 304, a latch 306, a regular logic data path 308, a regular logic data path 318, a regular logic data path 316, clock B 314, circuit 310, latch 316 included in clock domain A. FIG. 3 also includes clock B 314 that is included in clock domain B. Clock domain A and clock domain B are separated by a dashed line. Clock domain B may include substantially similar circuitry as circuitry included in clock domain A. Latch 306 is a set-reset latch and latch 314 is a non-set-reset latch. In some embodiments, the latch 306 and latch 314 may be any type of latch (e.g., a high-performance, high-efficiency, set-reset, positive edge triggered, negative edge triggered). Regular logic data path 308, regular logic data path 310, and regular logic data path 318 may be the same logic data path or different logic data paths. The latch 306 may include a data port (D), a reset port (reset), a scan-enable port (SI), clock input (clock), and a data output (Q). The circuit 312 may include a multiplexer 320 and an OR gate 322. The latch 316 may include a data port (D), a scan enable port (SI), a clock input (clock), and an output (Q).

Starting with electrical signal generation throughout FIG. 3, a reset 302 may output an electrical signal the reset port (reset) of the latch 306. When a reset 302 outputs a "high" signal, the latch 306 gets loaded with '0'. The same outputted high signal may be used to gate the clock A 304 feeding the latch 314, and then goes to a select line of the multiplexer 320 feeding the data port of the latch 316. For latch 316, when reset signal is "high," the latch 316 data port is fed with the "initial" data, while the clock input of latch 316 is also "high." Thus, both the set-reset latch 306 and the non-set-reset latch 316 can be loaded with the initial data in a same clock cycle when reset 302 outputs a "high" signal. In some cases, a set-latch, or a different latch, electrical-signal may replace the reset 302. The reset 302 may transmit an electrical signal to a select line of the multiplexer 320. The reset 302 may also be connected to a plethora of different circuits 312, regular logic data paths 308, and latches 316. A '0' or a '1' may be inputted to the multiplexer 320 from a power source. In some cases, the power source may have an electrical connection between power voltage levels and a multiplexer 320 input, or a "buffer" between ground level to the multiplexer 320 input. In some cases, the power voltage may output a (e.g. high level) in conjunction with an inverter circuit for '0' level input to the multiplexer 320, or two inverters in series may flip the '0' to a '1' to the multiplexer 320 input. The multiplexer 320 may receive a '1' (i.e., if a reset value of '1' is required) or a '0' (i.e., if a reset value of '0' is required).

Clock A 304 may also output an electrical signal to the clock input of latch 306. The regular logic data path 308 may also output an electrical signal, either a "0" or a "1," to data port of latch 306. Latch 306 may then out put an electrical signal from the data output to the regular logic data path 310. The regular logic data path 310 may then perform an operation on the received electrical signal from latch 306, and then output the electrical signal to the multiplexer 320 of circuit 312, where an electrical signal is waiting from the reset 302. The multiplexer 320 may then output an electrical signal that is an initial value to a data port of the latch 316. Clock B 314 located in clock domain B, different than clock domain A and with a different clock frequency, may transmit an electrical signal to the OR gate 322 of circuit 312. Since clock B 314 may transmit an electrical signal to the OR gate 322 of circuit 312, latch 306 and latch 316 may be initialized simultaneously in a single clock cycle, rather than sequentially, one clock domain proceeding another. The OR gate 322, where an electrical signal from reset 302 and an electrical signal from clock B 314 have been sent, may output an electrical signal to the clock input of latch 316. Latch 316 may then output an electrical signal to either the regular logic data path 318, a similarly typed latch, or another circuit 312, none of which is shown.

In the current state of the art, scan chains are grouped according to a same latch type, and initialized in sequential order. The groups can be split into a sequence of series that can be executed independently and in parallel, but a duration of initializing the most complex latch group may be a limiting factor. In a case of multiple clock domains, initialization always needs to happen in at least as many chunks as different clocks or groups that exist. Aspects of the present disclosure provide a way to initiate and then run all scan chains simultaneously.

Figure 4:
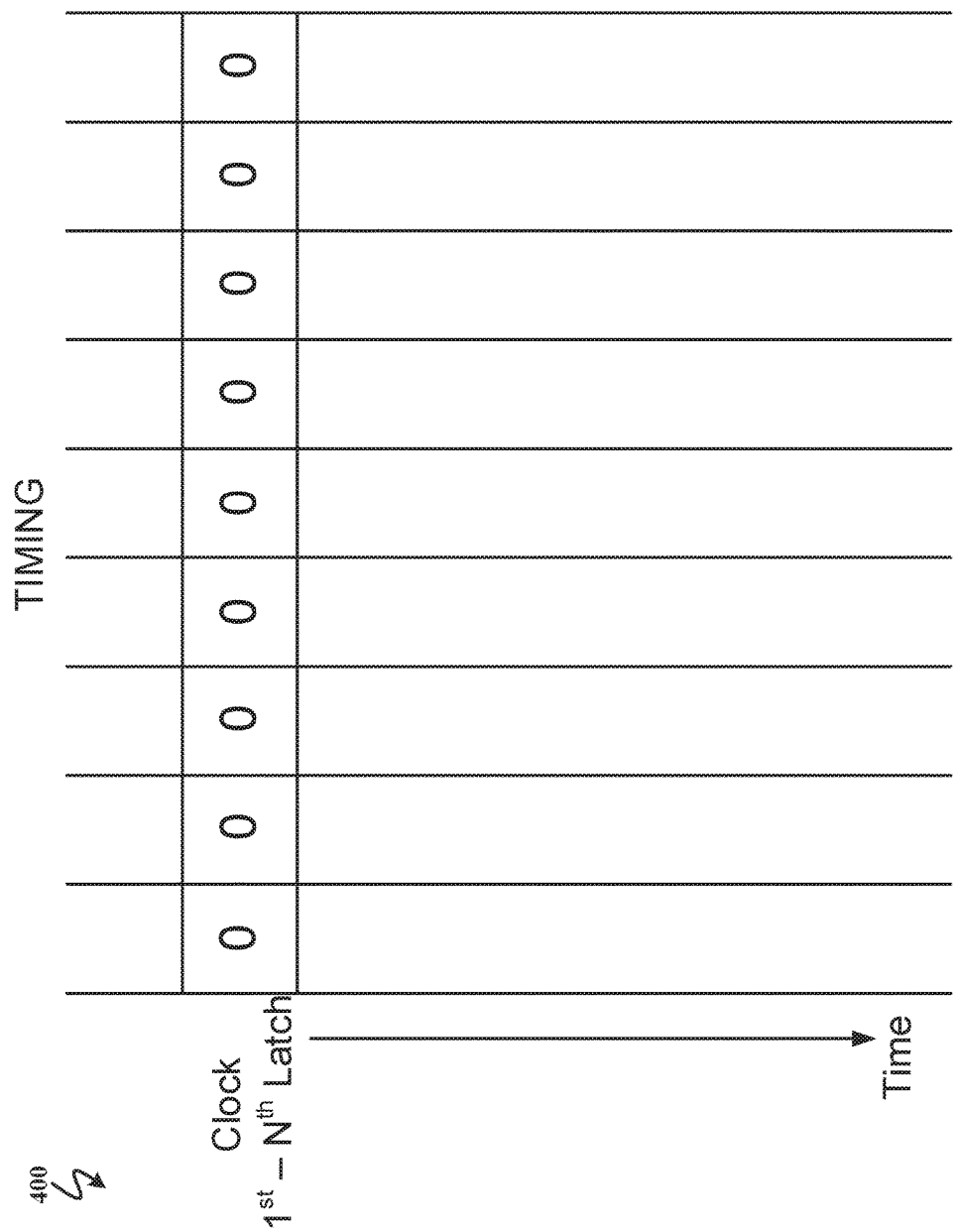
FIG. 4 is a block diagram of scan initialization timing of all latch types within an integrated circuit according to at least one embodiment.

FIG. 4 illustrates a block diagram of scan initialization timing of all latch types within an integrated circuit, in accordance with an illustrative embodiment of the present disclosure. FIG. 4 depicts a table of time as a column, and the number of groups, each with their own clock, as rows. Each latch and/or clock in a group may be in a different clock domain, the same clock domain, or some combination thereof. Clocks for latches one through N, where N may be any positive number, may have a scan chain initiated simultaneously at time zero. Each zero in each of the columns represents a value of each initialized latch.

Figure 5:
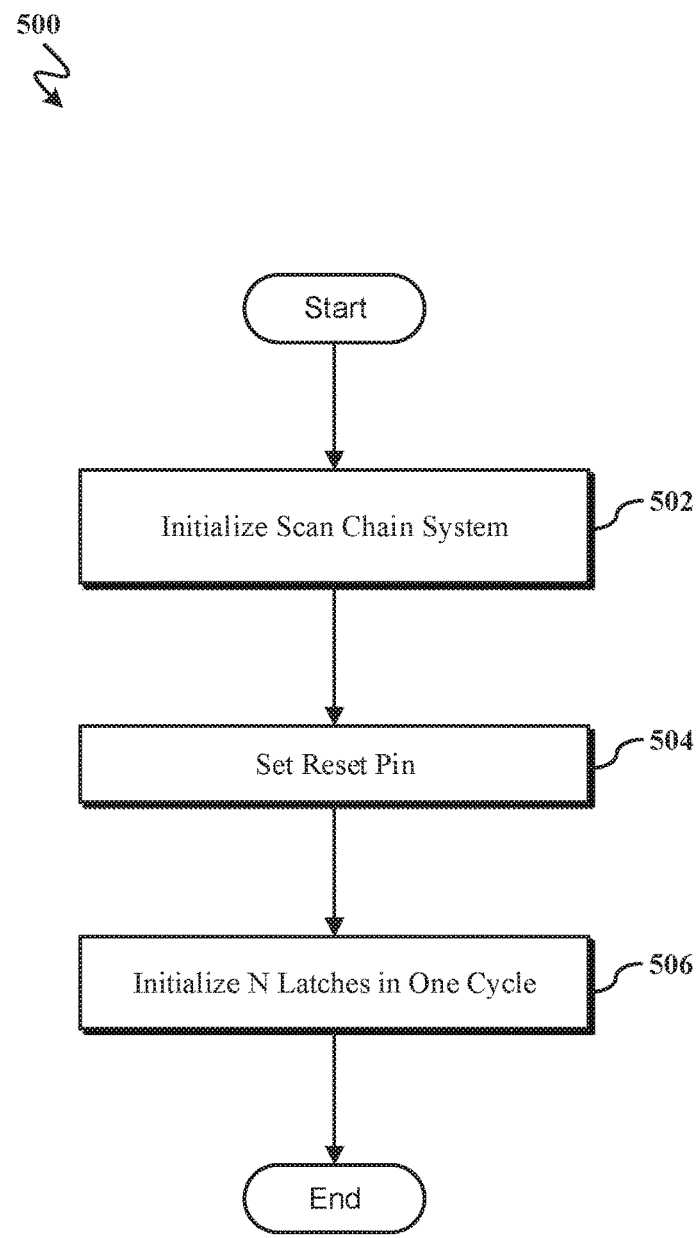
FIG. 5 is a method carrying out the scan chain initialization of an integrated circuit according to at least one embodiment.

Referring now to FIG. 5 illustrates a method carrying out the scan chain initialization of an integrated circuit is depicted. At 502, a scan chain program initializes the scan chain system. The scan chain program may begin automatically, e.g. if the integrated circuit is positioned within a particular orientation or fixture, or when a user determines that the integrated circuit is ready to be tested. When the circuit is set into a test mode, the latches enable a data stream to be shifted from one latch into the next. Once a complete data word has been shifted into the circuit under test, it can be latched into place so it drives external signals. Shifting the word also generally returns the input values from the signals configured as inputs. The scan chain program may further initialize circuits including disparate latches and clock domains simultaneously. When step 502 is complete, the scan chain program may proceed to 504.

At 504, the scan chain program sets a reset pin. The reset pin may be the reset 202 depicted in FIG. 2. In some cases, the difference between latch types that a circuit 204 is integrated in between may not be a set-reset latch and a set-reset latch. In this case, another type of latch or pin may be set by the scan chain program. In some embodiments, a first latch may be a positive edge triggered latch and the proceeding latch may be a negative edge triggered latch. In some embodiments, a circuit may be introduced in between disparate latch types, a first latch and a second latch, and any latches proceeding the second latch may be the same latch type as the second latch. Continuing the example, the circuit may be electrically connected to the second latch and all of the proceeding same or similar latches, or some combination thereof.

Then at 506, the scan chain program initializes all latches in one cycle. The latches may be any latch type currently known to anyone with ordinary skill in the art, and may be included in one or more clock frequency domains. After all of the latches have been initialized at step 506, the method may conclude.

The inventive method and device can be used for scanning methods such as boundary scans, as well as for scanning methods that not need dedicated controllers performing the scan operations.

Figure 6:
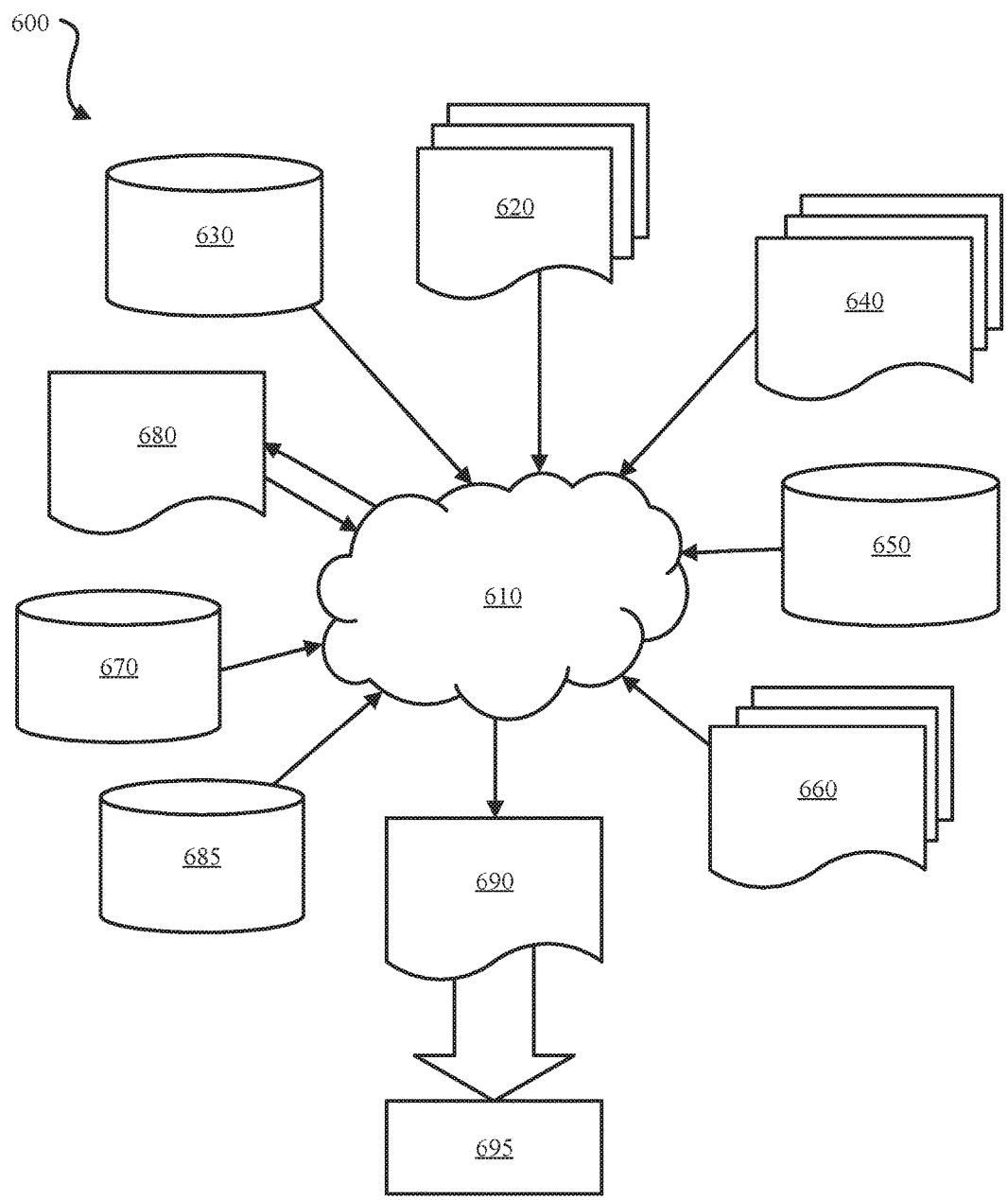
FIG. 6 illustrates a flow diagram of a design process used in semiconductor design, manufacture, and/or test, in accordance with embodiments of the present disclosure.

FIG. 6 shows a block diagram of an exemplary design flow 600 used for example, in semiconductor IC logic design, simulation, test, layout, and manufacture. Design flow 600 includes processes, machines, and/or mechanisms for processing design structures or devices to generate logically or otherwise functionally equivalent representations of the design structures and/or devices described above and shown in FIGS. 1 through 5. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1 through 5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1 through 6 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 through 5. In one embodiment, design structure 690 may comprise a compiled, executable HDL simulation model that functionally simulates the devices shown in FIGS. 1 through 5.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 through 5. Design structure 690 may then proceed to a stage 695 where, for example, design structure 690: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The terminology used herein is for the purpose of describing particular embodiments only and is not intended to limit the invention. As used herein, the singular forms "a," "an," and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As will be appreciated by one skilled in the art, aspects of the present inventive subject matter may be embodied as a system, method or computer program product. Accordingly, aspects of the present inventive subject matter may take the form of an entirely hardware embodiment, or embodiments can combine software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. An integrated circuit comprising:
   a reset electrically connected to a plurality of circuits, a reset input of a first latch, a select line of a multiplexor and an OR gate, the multiplexor receives data from a power source, the power source has an electrical connection between power voltage levels and an input of the multiplexor, both the multiplexor and the OR gate comprise a circuit that is not included in the plurality of circuits, the first latch comprising the reset input, a data port, a scan enable input, a clock input, and a data output, wherein the circuit is integrated in between the first latch and a second latch;
   a first regular logic data path electrically connected to the first latch data port;
   the first latch data output electrically connected to a second regular logic data path;
   the second regular logic data path electrically connected to the multiplexor;
   a first clock electrically connected to the first latch clock input;
   a second clock electrically connected to the OR gate, wherein the first clock and the second clock are in a same clock domain;
   the OR gate electrically connected to a clock input of the second latch, the second latch includes the clock input, a scan enable input, a data input, and a data output;
   the multiplexor electrically connected to the data port of the latch; and
   the second latch data output electrically connected to a third regular logic data path, wherein the first regular logic data path and the second regular logic data path are the same regular logic data path, wherein the third regular logic data path is a separate logic path, wherein the first latch is a high-performance latch and the second latch is a high-efficiency latch.

* * * * *